United States Patent
Nagata et al.

(10) Patent No.: US 7,187,603 B2
(45) Date of Patent: Mar. 6, 2007

(54) SEMICONDUCTOR MEMORY DEVICE, REPAIR SEARCH METHOD, AND SELF-REPAIR METHOD

(75) Inventors: Kou Nagata, Kanagawa (JP); Hiroaki Kodama, Chiba (JP)

(73) Assignee: Sony Corporation, Tokyo (JP)

( * ) Notice: Subject to any disclaimer, the term of this patent is extended or adjusted under 35 U.S.C. 154(b) by 424 days.

(21) Appl. No.: 10/774,573

(22) Filed: Feb. 10, 2004

(65) Prior Publication Data
US 2004/0208070 A1    Oct. 21, 2004

(30) Foreign Application Priority Data
Feb. 12, 2003   (JP)   ............... P2003-033187

(51) Int. Cl.
*G11C 7/00*   (2006.01)
(52) U.S. Cl. ...................... 365/200; 365/201
(58) Field of Classification Search ................ 365/201, 365/230.03, 189.08, 189.03
See application file for complete search history.

(56) References Cited

U.S. PATENT DOCUMENTS

| | | | |
|---|---|---|---|
| 2004/0246791 A1* | 12/2004 | Nagata et al. | ............... 365/200 |
| 2005/0007841 A1* | 1/2005 | Nagata et al. | ............... 365/200 |

FOREIGN PATENT DOCUMENTS

| | | |
|---|---|---|
| JP | 07-146340 | 6/1995 |
| JP | 2002-117697 | 4/2002 |

OTHER PUBLICATIONS

U.S. Appl. No. 10/827,351 filed Apr. 20, 2004, Nagata et al.
U.S. Appl. No. 10/823,572 filed Apr. 14, 2004, Nagata et al.

* cited by examiner

*Primary Examiner*—Anh Phung
*Assistant Examiner*—Hien Nguyen
(74) *Attorney, Agent, or Firm*—Rader, Fishman & Grauer PLLC; Ronald P. Kananen

(57) ABSTRACT

A semiconductor memory device according to the present invention includes a BIST circuit for evaluating quality of each of memory cells and a buffer (memory) for storing address information of abnormal cells which information is sent from the BIST circuit, the BIST circuit and the buffer being mounted on the same chip as a DRAM. A repair search circuit determines a minimum of address information required to determine redundant cells for replacement in the address information of the abnormal cells which information is sent from the BIST circuit, and stores only the determined address information in the buffer. Since only a minimum of address pairs required determining the redundant cells for repairing the abnormal cells are stored in the buffer, circuit scale is reduced. Further, processing for calculating address information of the redundant cells for repairing the abnormal cells can be performed at high speed.

24 Claims, 13 Drawing Sheets

FIG. 4

| PRESENCE BIT | X MASK BIT | XD BIT ↓ | X ADDRESS | Y ADDRESS | YD BIT ↓ | Y MASK BIT |
|---|---|---|---|---|---|---|
| 1 | 0 | 0 | 12 | 5 | 0 | 0 |
| 1 | 0 | 0 | 6 | 5 | 1 | 1 |
| 1 | 1 | 1 | 12 | 8 | 0 | 0 |
| 1 | 0 | 0 | 5 | 35 | 0 | 0 |
| 1 | 0 | 1 | 6 | 35 | 1 | 0 |
|  |  |  |  |  |  |  |
|  |  |  |  |  |  |  |
|  |  |  |  |  |  |  |

OVERFLOW
0

SEMICONDUCTOR MEMORY DEVICE, REPAIR SEARCH METHOD, AND SELF-REPAIR METHOD

BACKGROUND OF THE INVENTION

The present invention relates to a semiconductor memory device such as a DRAM (Dynamic Random Access Memory), an SRAM (Static Random Access Memory) or the like, and a repair search method and a self-repair method in the semiconductor memory device, and particularly to a semiconductor memory device including a redundancy search circuit for replacing faulty (defective) memory cells with redundant memory cells included in advance, and a repair search method and a self-repair method in the semiconductor memory device.

With a recent great increase in a degree of integration of semiconductor memory devices such as DRAMs and the like, yield has become a challenge in manufacturing. It is nearly impossible in practice to raise yields to 100%; it is assumed in a present situation that faulty memory cells (hereinafter referred to occasionally as abnormal bits) exist.

When there are faulty memory cells, however, the semiconductor memory device cannot be shipped as a product, of course.

Accordingly, in practice, a number of spare memory cells are provided. When a faulty memory cell is found, the faulty memory cell is replaced with a spare memory cell to repair the faulty chip.

Specifically, the repair is realized by providing spare memory cells as redundant cells and if there is a faulty memory cell, replacing the faulty memory cell with a spare memory cell in a unit of a bit line or an address line. Whether memory cells are good or faulty is conventionally determined by using an external memory tester in a stage of shipment from a factory.

On the other hand, with recent dramatic improvement in LSI technology, there have been increasing cases where a plurality of memories and logic units are simultaneously mounted on an LSI chip in a mixed manner. It has therefore become actually difficult to test individual memories independently. In addition, with faster performance speed of LSI, it is difficult to test and evaluate the individual memories using an external memory tester. Therefore, a memory test method incorporated in an LSI has become essential. Even if the individual memories can be tested and evaluated using an external memory tester, such a memory tester is very expensive. Hence, as cost of testing in LSI manufacturing has recently been increasing very much, a method that enables high-speed testing at performance speed of LSI and can be realized inexpensively is desired in a current situation.

As described above, in testing and evaluation of a semiconductor memory device, whether memory cells are good or faulty is evaluated bit by bit (memory cell by memory cell). A part included in an LSI to perform the evaluation is generally referred to as a BIST (built-in self-test) circuit. Commercially available test circuits are mainly for SRAMs in a current situation. While there are some test circuits commercially available for DRAMs, each manufacturer develops test circuits for their own DRAM architecture.

A BIST circuit determines whether the memory has an abnormal (defective or faulty) bit, and when there is an abnormal bit, the BIST circuit determines an address of the bit (memory cell). The semiconductor memory device is provided with dummy bit lines and word lines for repairing abnormal bits found by the BIST circuit.

The dummy bit lines and word lines are referred to as redundant lines. The BIST circuit performs processing only for finding abnormal bits. Hence, subsequent processing determines actually how to use the redundant lines.

A plurality of redundant lines are provided in a column direction and a row direction. It is therefore necessary to determine which abnormal bit is to be replaced by which redundant line. This replacement of an abnormal bit with one of the redundant lines is referred to as repair. A process of determining which redundant line is to be used to replace the abnormal bit is referred to as repair search. Completing the repair on the chip on the basis of a result of the search is referred to as self-repair.

In the case of using an external memory tester, an external memory tester computer is used to perform calculation for repair search (see Patent Document 1, for example). Alternatively, a built-in BIST circuit is provided with not only an evaluation function for determining whether there is an abnormal bit but also a repair search (redundancy analysis) function for determining which redundant line is to be used to replace the abnormal bit (see Patent Document 2, for example).

[Patent Document 1]
  Japanese Patent Laid-Open No. Hei 7-146340

[Patent Document 2]
  Japanese Patent Laid-Open No. 2002-117697

However, even in the case of an LSI including a BIST circuit, when information of each abnormal bit is taken out to the outside and calculation is performed by an external computer as in a conventional technique described in Patent Document 1, a memory of the external computer has information on normality/abnormality of bits at all addresses. Thus a capacity of the memory is significantly consumed, and also calculation takes much time.

In the case where a built-in BIST circuit is provided with a repair search function as in a conventional technique described in Patent Document 2, a plurality of combinations (six combinations in this example) are considered as combinations enabling repair. Since a method is employed in which locations for storing addresses for all the combinations are provided and repairability is determined simultaneously for all the six combinations, it is considered that a circuit scale accordingly becomes large.

SUMMARY OF THE INVENTION

It is a first object of the present invention to provide a semiconductor memory device that can perform repair search calculation at high speed with a low capacity, and a repair search method in the semiconductor memory device.

It is a second object of the present invention to provide a self-repair method that can determine final repair addresses on a small circuit scale on the basis of a result of repair search.

In order to achieve the first object, according to the present invention, there is provided a semiconductor memory device including: a memory unit including a memory core formed by arranging a plurality of memory cells in a form of a matrix, a block as a unit having a redundant line including redundant cells for repairing an abnormal cell occurring in the memory core, and further one such unit block or a plurality of such unit blocks arranged in a form of a matrix; built-in self-test means mounted on a same chip as the memory unit, for evaluating quality of each of the memory cells; and storing means mounted on the same chip as the memory unit.

The semiconductor memory device further includes repair search means for storing in the storing means only a minimum of address pairs required to determine redundant cells for repair among address pairs in a row direction and a column direction of abnormal cells, the address pairs being sent from the built-in self-test means.

In the thus formed semiconductor memory device, the memory unit has one unit block or a plurality of unit blocks arranged in the form of a matrix, and each of the unit blocks has a plurality of memory cells arranged in the form of a matrix and a redundant line including redundant cells for repairing an abnormal cell. The built-in self-test means evaluates quality of each of the memory cells of the memory unit, and then sends address pairs of abnormal cells to the repair search means. In response to this, the repair search means stores only a minimum of address pairs required to determine redundant cells for repairing the abnormal cells in the storing means.

A point of the present invention is that since only a minimum of address pairs required are stored, a lower memory capacity as compared with a case of storing all the address pairs of the abnormal cells is sufficient. Further, processing for calculating address information of the redundant cells for repairing the abnormal cells on the basis of the stored address pairs can be performed at high speed.

In order to achieve the second object, according to the present invention, there is provided a semiconductor memory device including: a memory unit including a memory core formed by arranging a plurality of memory cells in a form of a matrix, a block as a unit having a redundant line including redundant cells for repairing an abnormal cell occurring in the memory core, and further one such unit block or a plurality of such unit blocks arranged in a form of a matrix; built-in self-test means mounted on a same chip as the memory unit, for evaluating quality of each of the memory cells; and storing means mounted on the same chip as the memory unit.

The semiconductor memory device further includes: repair search means for storing in the storing means only a minimum of address pairs required to determine redundant cells for repair among address pairs in a row direction and a column direction of abnormal cells, the address pairs being sent from the built-in self-test means; and built-in self-repair means mounted on the same chip as the memory unit, for calculating final repair address information of the redundant cells for repairing the abnormal cells on the basis of the address pairs stored in the storing means.

In the other semiconductor memory device thus formed, the memory unit includes one unit block or a plurality of unit blocks arranged in the form of a matrix, and each of the unit blocks has a plurality of memory cells arranged in the form of a matrix and a redundant line including redundant cells for repairing an abnormal cell. The built-in self-test means evaluates quality of each of the memory cells of the memory unit, and then sends address pairs of abnormal cells to the repair search means.

In response to this, the repair search means stores only a minimum of address pairs required to determine redundant lines for repairing the abnormal cells in the storing means. Then, on the basis of the address pairs stored in the storing means, the built-in self-repair means calculates address information of the redundant lines for repairing the abnormal cells. Thus, in the present invention, since only a minimum of address pairs required are stored, a lower memory capacity required as compared with a case of storing all the address pairs of the abnormal cells results in a correspondingly smaller circuit scale. In addition, since the built-in self-repair means is also mounted on the same chip as the memory unit, processing for the calculation can be performed at performance speed of the memory unit, and hence the processing for calculating the address information of the redundant cells for repairing the abnormal cells can be performed at actual operating speed.

BRIEF DESCRIPTION OF THE DRAWINGS

FIG. 4 is a diagram showing a result of processing by the repair search circuit;

DETAILED DESCRIPTION OF THE PREFERRED EMBODIMENTS

Preferred embodiments of the present invention will hereinafter be described in detail with reference to the drawings.

[First Embodiment]

Figure 1:
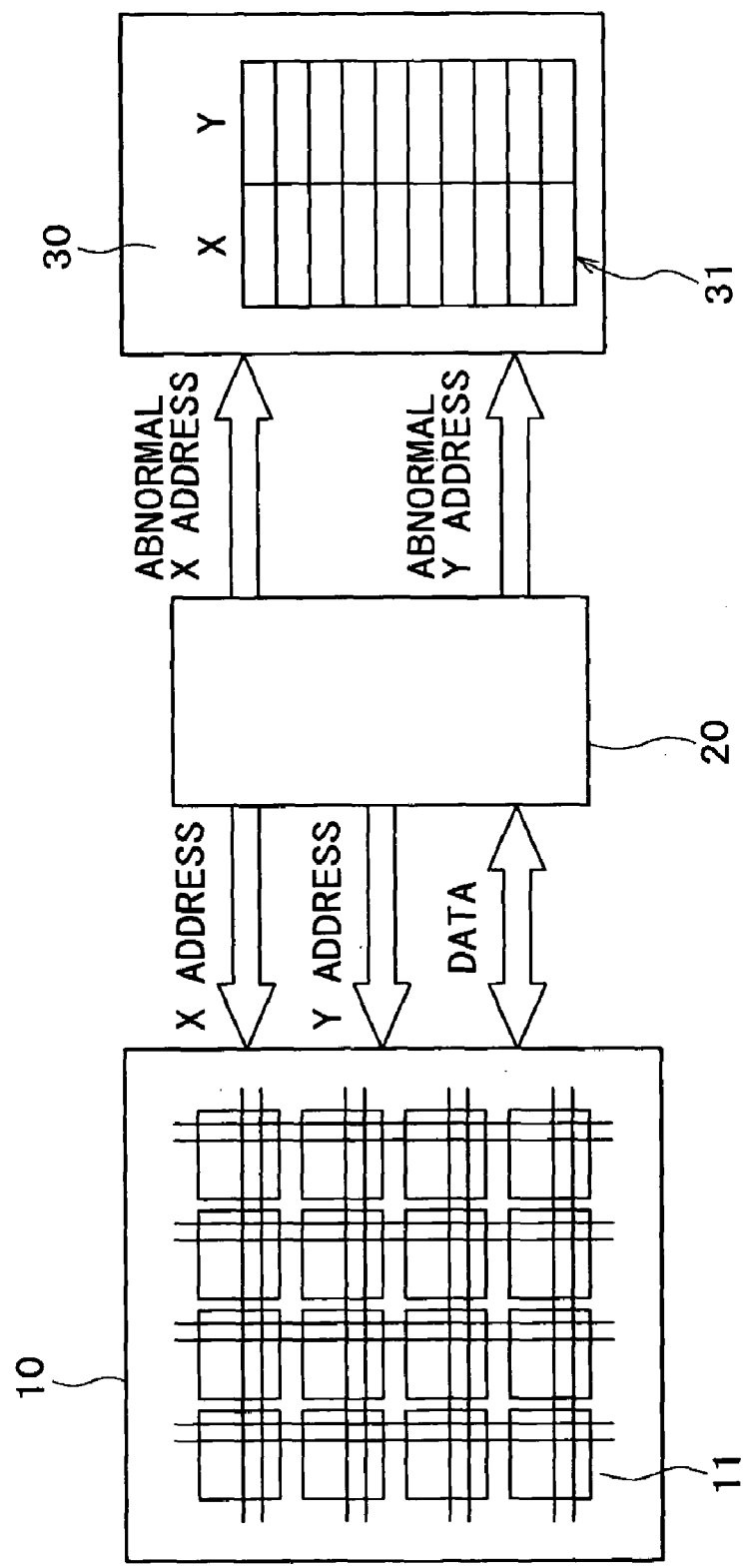
FIG. 1 is a block diagram showing a configuration of a semiconductor memory device according to a first embodiment of the present invention.

As is clear from FIG. 1, a semiconductor memory device (LSI) according to a first embodiment has a DRAM 10 serving as a memory unit, a BIST (built-in self-test) circuit 20, and a repair search (redundancy analysis) circuit 30. These components are mounted on an identical LSI chip.

Figure 2:
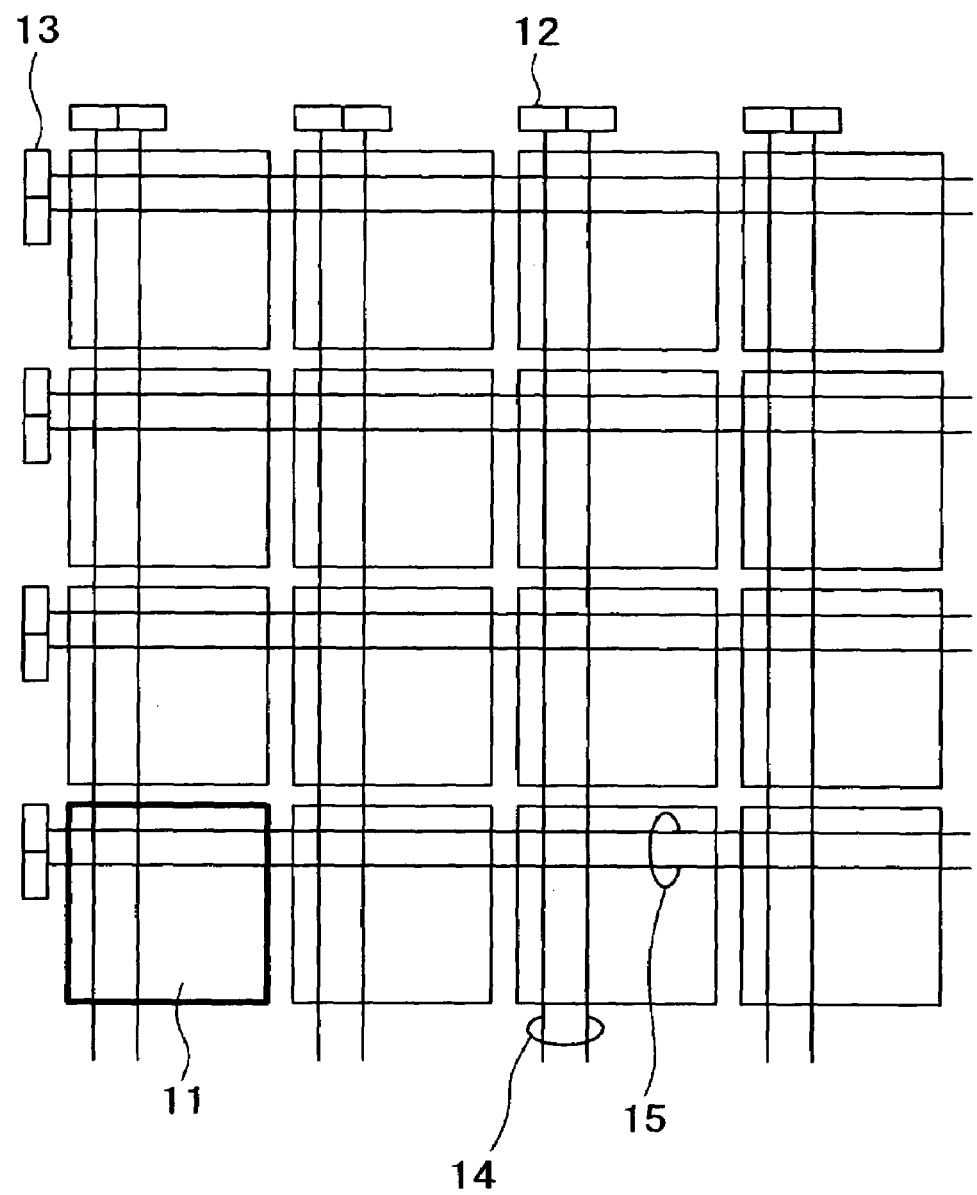
FIG. 2 is a block diagram showing an example of configuration of a DRAM.

As shown in FIG. 2, the DRAM 10 generally-includes individual small unit blocks (hereinafter referred to as "redundant blocks") 11 each including a memory core formed by arranging a plurality of memory cells in a form of a matrix and spare memory cells as redundant cells for repairing abnormal cells occurring in the memory core. A large number of (the number is one in some cases) such redundant blocks 11 are arranged in a form of a matrix. Ideally, it is desirable to use mechanical fuses 12 and 13 formed by wiring of Al (aluminum) or the like for a row and a column of each individual redundant block 11 and thereby repair each redundant block independently.

In practice, however, because of problems in mounting resulting from large size of the fuses 12 and 13, the DRAM 10 has a structure that uses a common redundant line for a plurality of redundant blocks to thereby group the redundant blocks and provides the fuses 12 and 13 for each group. Specifically, a row redundant line 14 is arranged in a so-called skewering form so as to pass through a plurality of redundant blocks in each row, and a column redundant line 15 is arranged in a skewering form so as to pass through a plurality of redundant blocks in each column. Fuses 12 and 13 are provided for the respective redundant lines 14 and 15.

The BIST circuit 20 evaluates quality of each memory cell in the DRAM 10. Specifically, the BIST circuit 20 determines whether there is an abnormal bit (a defective memory cell or a faulty memory cell) in each redundant block 11. When there is an abnormal bit, the BIST circuit 20 determines an address of the abnormal bit at a high LSI performance speed. The address information of the abnormal bit detected by the BIST circuit 20 is sent from the BIST circuit 20 to the repair search circuit 30.

The repair search circuit 30 processes the address information of the abnormal bit sent from the BIST circuit 20 in real time, and stores only minimum address information required to determine redundant lines (redundant cells) used for repairing abnormal cells in a buffer (memory) 31 provided on the LSI chip. The address information of the abnormal bit is represented by a pair of row address data and column address data. The address data pair is referred to as an X and a Y address.

A series of processing steps in which the BIST circuit 20 determines whether there is an abnormal bit in each redundant block 11 at the LSI performance speed, and the repair search circuit 30 processes the address information in real time and stores the address information in the buffer 31 will be referred to as stage one.

A series of processing steps in which the address information stored in the buffer 31 is transferred to for example an external computer or a CPU on the chip, and the computer determines redundant lines to be used on the basis of the address information transferred from the buffer 31 while considering a relation between the redundant blocks 11 will be referred to as stage two.

That is, processing in stage one is performed by the BIST circuit 20 and the repair search circuit 30 implemented as hardware. Processing in stage two is performed by software of the external computer. The processing in stages one and two will be described in the following.

(Stage One)

Now suppose that numbers of redundant lines usable in an X-direction (column direction) and a Y-direction (row direction) are n1 and n2, respectively. Consideration will be given to a capacity (hereinafter referred to as a "buffer capacity") of the buffer 31 required to store address information of abnormal bits on the chip.

When there are (n2+1) abnormal bits or more on one address line in the X-direction, the address line in the X-direction needs to be replaced by a redundant line in the X-direction unconditionally. Similarly, when there are (n1+1) abnormal bits or more on one address line in the Y-direction, the address line in the Y-direction needs to be replaced by a redundant line in the Y-direction unconditionally. Hence, a buffer capacity of n2 buffers suffices as a buffer capacity required per address line in the X-direction (per redundant line in the X-direction).

However, a pair of an X and a Y address is stored in one buffer. This is because when another abnormal bit occurs on the address line in the X-direction, the address line may be set as an address line to be replaced by a redundant line and hence it is not necessary to store an (n2+1)th piece of data. Thus, when there are n1 redundant lines in the X-direction (column redundant lines 15), a buffer capacity of (n1×n2) buffers suffices as a buffer capacity required for the X-direction. Similarly, a buffer capacity of (n1×n2) buffers suffices as a buffer capacity required for the Y-direction. It consequently suffices to prepare (2×n1×n2) buffers in total.

For example, in the DRAM 10 of the structure shown in FIG. 2, n1 and n2 are both 2, that is, there are two redundant lines 14 and two redundant lines 15. Consequently, in this example, it suffices to prepare a buffer having a buffer capacity for storing eight (=2×2×2) pairs of X and Y addresses per redundant block 11 as the buffer 31 in the repair search circuit 30.

Figure 3:
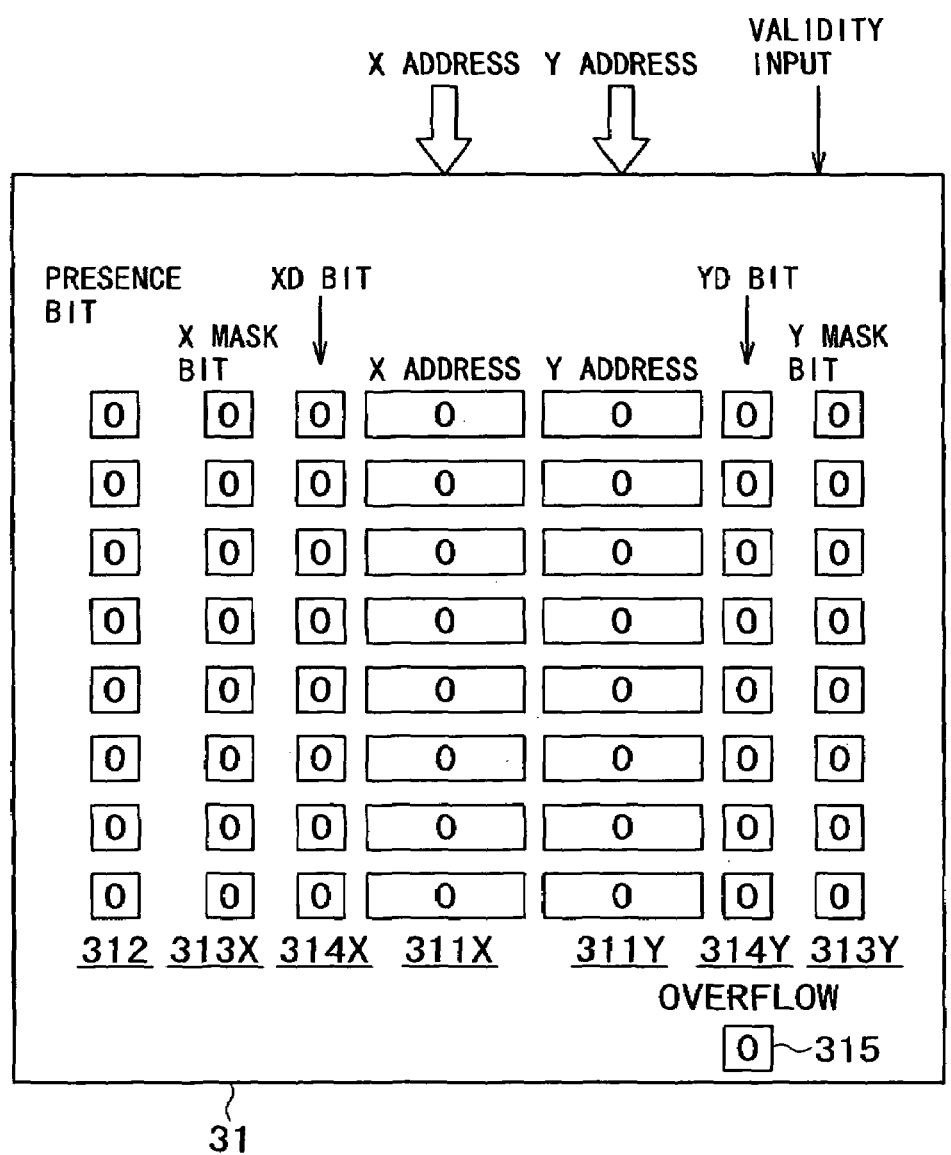
FIG. 3 is a block diagram showing a concrete example of configuration of a repair search circuit.

FIG. 3 is a block diagram showing a concrete example of configuration of the repair search circuit 30. The repair search circuit 30 according to this configuration example has, as the buffer 31, eight X address buffers 311X and eight Y address buffers 311Y in correspondence with the two redundant lines 14 and the two redundant lines 15, and also has presence bits 312, mask bits 313, D bits 314, and an overflow bit 315 to realize the processing in stage one. There are mask bits 313 and D bits 314 for X (313X and 314X) and mask bits 313 and D bits 314 for Y (313Y and 314Y).

A presence bit 312 indicates validity (1)/invalidity (0) of an address pair stored in an X and a Y address buffer 311X and 311Y. The overflow bit 315 determines whether repair by the redundant lines 14 and 15 is possible (1)/impossible (0).

In FIG. 3, an X and a Y address indicating a position of an abnormal bit on the DRAM 10 and valid bit information indicating that the input of the X and Y addresses is valid are inputted from the BIST circuit 20 to the repair search circuit 30. When the input of the X and Y addresses is valid, the repair search circuit 30 carries out the following processes (1) to (5).

(1) When the X and Y address pair is inputted, the repair search circuit 30 determines whether the address pair is already present as a pair in address buffers 311X and 311Y. When the address pair is already present as a pair in address buffers 311X and 311Y, the repair search circuit 30 discards the inputted X and Y address pair.

(2) The repair search circuit 30 determines whether either one of the addresses of the inputted X and Y address pair is set as an address to be masked (repaired) (hereinafter referred to as "mask-set"), that is, whether the mask bit 313X or 313Y is "1." When the address is a mask-set address (hereinafter referred to as a "mask address"), the repair search circuit 30 discards the inputted X and Y address pair.

(3) In cases other than the foregoing (1) and (2), the repair search circuit 30 stores the inputted X and Y address pair in empty address buffers 311X and 311Y. At the time of storing the new address pair, in cases where the same value as the X or Y address has been present in a buffer 311X or 311Y, the XD bit 314X is set to 1 when the same X value is present, and the YD bit 314Y is set to 1 when the same Y value is present, to indicate that the address is already stored in two buffers.

In this case, the number of redundant lines in both the X-direction and the Y-direction is 2. When the number of redundant lines in the X-direction or the Y-direction is 3 or more, however, there are a plurality of XD bits or YD bits, rather than one XD bit and one YD bit, for each address pair. When there are four redundant lines in the X-direction, for example, three XD bits may be provided for each address pair to indicate that the same X address value has come twice, three times, and four times, or three XD bits may be provided to be used as a counter.

(4) When either one of the addresses of the inputted X and Y address pair has been stored in an address buffer 311X or 311Y in the past and the D bit 314X or 314Y is "1," it means that the address is inputted for a third time, and therefore the address is set as a mask address. The repair search circuit 30 discards the inputted X and Y address pair, and sets a mask bit 313X or 313Y of the address having the D bit 314X or 314Y of "1" to "1" to indicate that the address is a mask address.

(5) When the inputted X and Y address pair is to be stored in address buffers 311X and 311Y, but the buffers 311X and 311Y are already full and thus there is no space for storing the inputted X and Y address pair, repair is impossible, and hence the repair search circuit 30 sets the overflow bit 315 to "1" to indicate an overflow (impossibility of repair). Then the processing in stage one is ended.

Since the above-described processing in stage one is realized by hardware, when one circuit set is provided for one redundant block and a plurality of sets are disposed on the chip, the plurality of circuit sets all operate in parallel with each other, thus resulting in good efficiency.

The processing in stage one performed by the repair search circuit 30 will be described more specifically by taking numerical examples. Consideration will be given to a case where (12, 5), (6, 5), (12, 8), (5, 35), (12, 6), (6, 35), and (7, 5) are sent in that order from the BIST circuit 20 to the repair search circuit 30 as an example of X and Y address pairs of abnormal bits in a redundant block.

First, when the X and Y addresses (12, 5) are inputted, since the addresses are an address pair inputted for a first time, the addresses are directly stored in X and Y address buffers 311X and 311Y. At this time, since the address pair stored in the buffers 311X and 311Y is valid, the presence bit 312 is set to "1."

Next, when the X and Y addresses (6, 5) are inputted, since the addresses are not yet stored as a pair in address buffers 311X and 311Y and neither of the addresses is set as a mask address yet, the addresses are directly stored in buffers 311X and 311Y, and the presence bit 312 is set to "1." At this time, since the same address of 5 is already stored in a Y address buffer 311Y, the YD bit 314Y is set to "1."

Next, when the X and Y addresses (12, 8) are inputted, since the addresses are not yet stored as a pair in address buffers 311X and 311Y and neither of the addresses is set as a mask address yet, the addresses are directly stored in address buffers 311X and 311Y, and the presence bit 312 is set to "1." At this time, since the same address of 12 is already stored in an X address buffer 311X, the XD bit 314X is set to "1."

Next, when the X and Y addresses (5, 35) are inputted, since the addresses are not yet stored as a pair in address buffers 311X and 311Y and neither of the addresses is set as a mask address yet, the addresses are directly stored in address buffers 311X and 311Y, and the presence bit 312 is set to "1."

Next, when the X and Y addresses (12, 6) are inputted, the X address of 12 is already stored and there is an address pair having an XD bit of "1" (a previously inputted pair (12, 8)). Hence, the X address of 12 of the address pair (12, 6) inputted this time is inputted for a third time, and there are three address pairs having the same X address (12 in this case) and different Y addresses. Thus the pair (12, 6) is discarded, and an X mask bit 313X of the address pair (12, 8) having the XD bit of "1" is set to "1."

Next, when the X and Y addresses (6, 35) are inputted, since the addresses are not yet stored as a pair in address buffers 311X and 311Y and neither of the addresses is set as a mask address yet, the addresses are directly stored in buffers 311X and 311Y, and the presence bit 312 is set to "1."

Finally, when the X and Y addresses (7, 5) are inputted, reference to the Y mask bits 313Y indicates that the Y address of 5 is already set as a mask address, and hence address pair is discarded.

FIG. 4 shows a result of the processing by the repair search circuit 30, that is, contents of the X and Y address buffers 311X and 311Y and the bits 312 to 315 when for example (12, 5), (6, 5), (12, 8), (5, 35), (12, 6), (6, 35), and (7, 5) are thus sent in that order from the BIST circuit 20 to the repair search circuit 30 as X and Y address pairs of abnormal bits in a redundant block.

The result of the processing by the repair search circuit 30, that is, the data stored in the buffer 31 forms a chain or the like and is thereby transferred to the external computer by shift-out so that the processing is shifted to stage two. The processing in stage two will next be described.

(Stage Two)

In stage two, the external computer or the CPU on the chip, for example, determines final redundant lines to be used on the basis of the processing result in stage one.

Specifically, the processing in stage two covers processing parts that cannot be determined by the processing in stage one alone; the processing in stage two determines final mask addresses and an overflow. For example, when there are address pairs (X, Y) such as (1, 1), (2, 2), (3, 3), (4, 4), and (5, 5), repair is not possible, but the processing in stage one does not indicate an overflow. In a case of address pairs (X, Y) such as (1, 1), (2, 1), (3, 2), (4, 3), and (5, 4), the Y address of 1 is set as a mask address, but the processing in stage one does not set the Y address of 1 as a mask address.

There is not only one combination of maskable X and Y addresses but there are a plurality of combinations of maskable X and Y addresses within each redundant block. In this example, however, there are only two X-direction redundant lines 15 and two Y-direction redundant lines 14, and hence there are only six combinations at a maximum. When one redundant line is set by another redundant-block skewered, the combinations are reduced to three combinations; when two redundant lines are set, there is only one combination.

Accordingly, the mask addresses set by the processing in stage one are notified as information to other skewered redundant blocks, and mask addresses and an overflow are determined again. The number of possible combinations of redundant lines for the redundant blocks is reduced. After mask addresses used in each redundant block are fixed as much as possible by the processing up to this point, possible address sets are calculated one after another for each redundant block, and the calculation is performed until address sets become consistent as a whole.

When there are redundant blocks A, B, C, and D, for example, and the redundant blocks are in a skewered structure, the processing in stage two determines mask addresses (final repair addresses) and an overflow by the following procedure.

Figure 5:
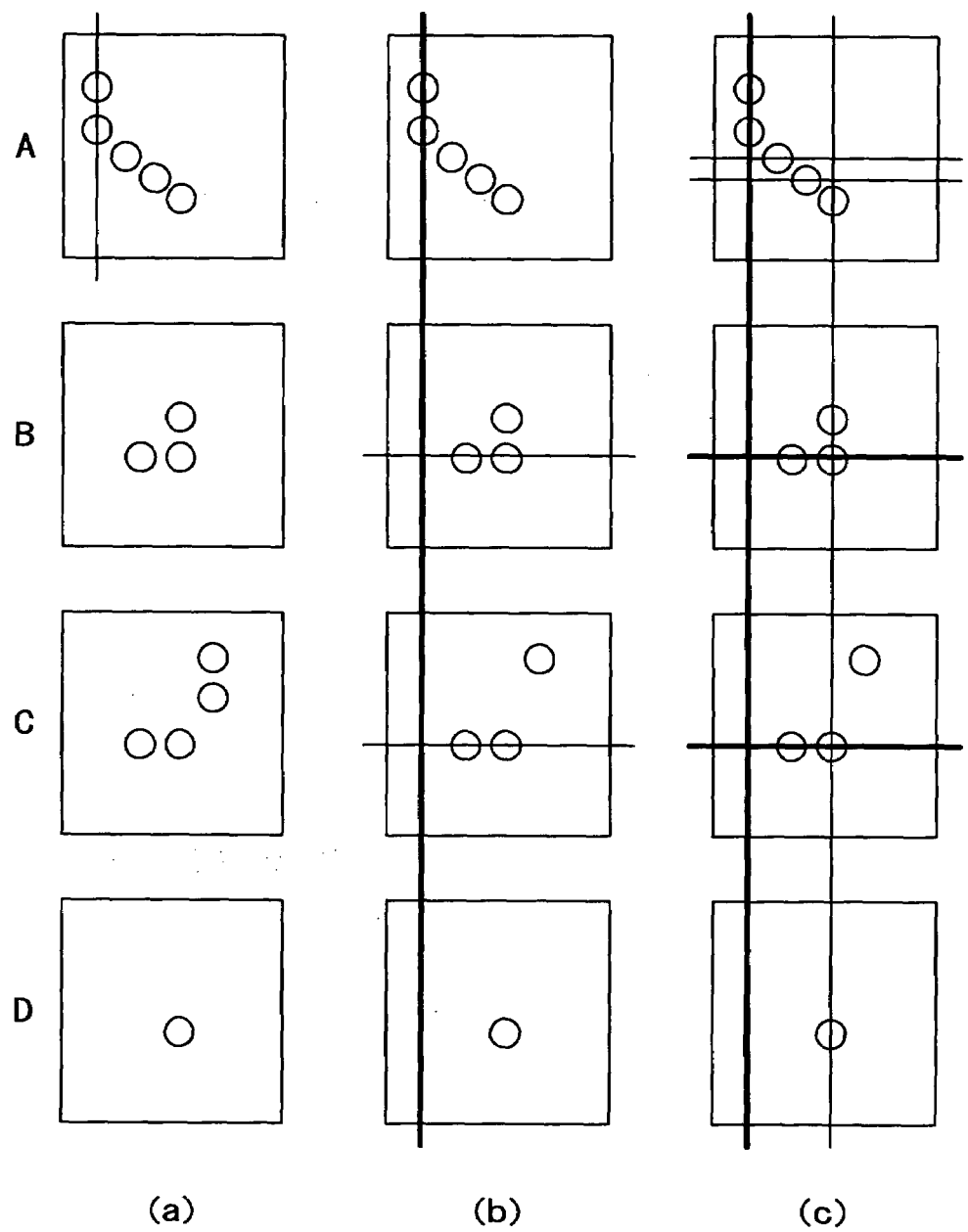
FIGS. 5($a$), 5($b$), and 5($c$) are conceptual diagrams of a procedure of processing in stage two.

(1) First, as shown in FIG. 5(a), as many mask addresses as possible are set in each redundant block.

(2) Next, as shown in FIG. 5(b), the redundant blocks give the set mask address information to each other, and further set mask addresses.

(3) Next, in this state, one of possible combinations of mask addresses (hereinafter referred to as "address pattern sets") for the redundant block A is first selected. Then, as shown in FIG. 5(c), the address pattern set selected in the redundant block A imposes a limitation on the redundant block B, and under the limitation, a possible address pattern set for the redundant block B is calculated.

(4) Next, the address pattern sets taken by the redundant blocks A and B impose a limitation on the redundant block C, and under the limitation, an address pattern set for the redundant block C is calculated. At this time, when the address pattern sets of the redundant blocks A and B make masking impossible in the redundant block C, a next possible address pattern set for the redundant block B is calculated. This processing is repeated. When all possible pattern sets for the redundant block B make masking impossible in the redundant block C, a next possible pattern for the redundant block A is calculated. The above processing is repeated.

(5) Then, under a limitation of the address pattern sets of the redundant blocks A, B, and C, a possible address pattern set for the redundant block D is calculated. When there is no possible address pattern set, a next address pattern set for the redundant block C is calculated.

The above processing is repeated. When all the redundant blocks A, B, C, and D can be masked, these address pattern sets are adopted. Then, the address pattern sets thus calculated are used to make repairs by blowing corresponding fuses 12 and 13 (see FIG. 2). It is to be noted that while description has been made by taking as an example the skewered structure of one dimension in the Y-direction, this processing is similarly applicable to a skewered structure of one dimension in the X-direction or of two dimensions in the X-direction and the Y-direction.

As described above, since the semiconductor memory device according to the first embodiment of the present invention employs a structure in which the BIST circuit 20 and the repair search circuit 30 are mounted on the same LSI chip as the DRAM 10, the semiconductor memory device can perform the processing of determining whether there is an abnormal bit, and when there is an abnormal bit, determining an address of the abnormal bit, and the processing of setting minimum address information required to determine redundant lines to be used and storing only the set address information in the buffer 31 at the LSI performance speed. This eliminates the need for an expensive memory tester capable of high-speed operation at an LSI performance speed.

In addition, the processing by the repair search circuit 30 on the chip leaves only abnormal bit address information necessary for redundant line analysis. This eliminates the conventional need for capturing information on normality/abnormality at all addresses, and can thus greatly reduce the capacity of the buffer (memory) used. This also makes it possible to increase speed of calculation for determining redundant lines to be used on the basis of the address information stored in the buffer 31.

Further, in determining redundant lines to be used, that is, redundant cells for replacement on the basis of the address information stored in the buffer 31, for each redundant block in which as many repair addresses as possible are set, address pattern sets that can mask faulty bits left unmasked by remaining redundant lines are generated one by one, and address pattern sets are found sequentially so as to be consistent with each other while redundant blocks of a group including a plurality of redundant blocks impose a limitation on each other.

Specifically, an address pattern set maskable in one redundant block is found, the found address pattern set imposes a limitation on another redundant block, an address pattern set maskable in the other redundant block is generated under the limitation, and the result imposes a limitation on a further redundant block. Such processing is repeated. Thus, speed of processing for finding a combination of maskable address patterns as a whole can be increased.

It is to be noted that while in the first embodiment, the address information stored in the buffer 31 as a result of the processing in stage one is transferred to the external computer and the computer performs the processing in stage two, it is possible to mount a microcomputer on the same chip as the DRAM 10, and transfer the address information stored in the buffer 31 to the microcomputer to perform the processing in stage two.

[Second Embodiment]

Figure 6:
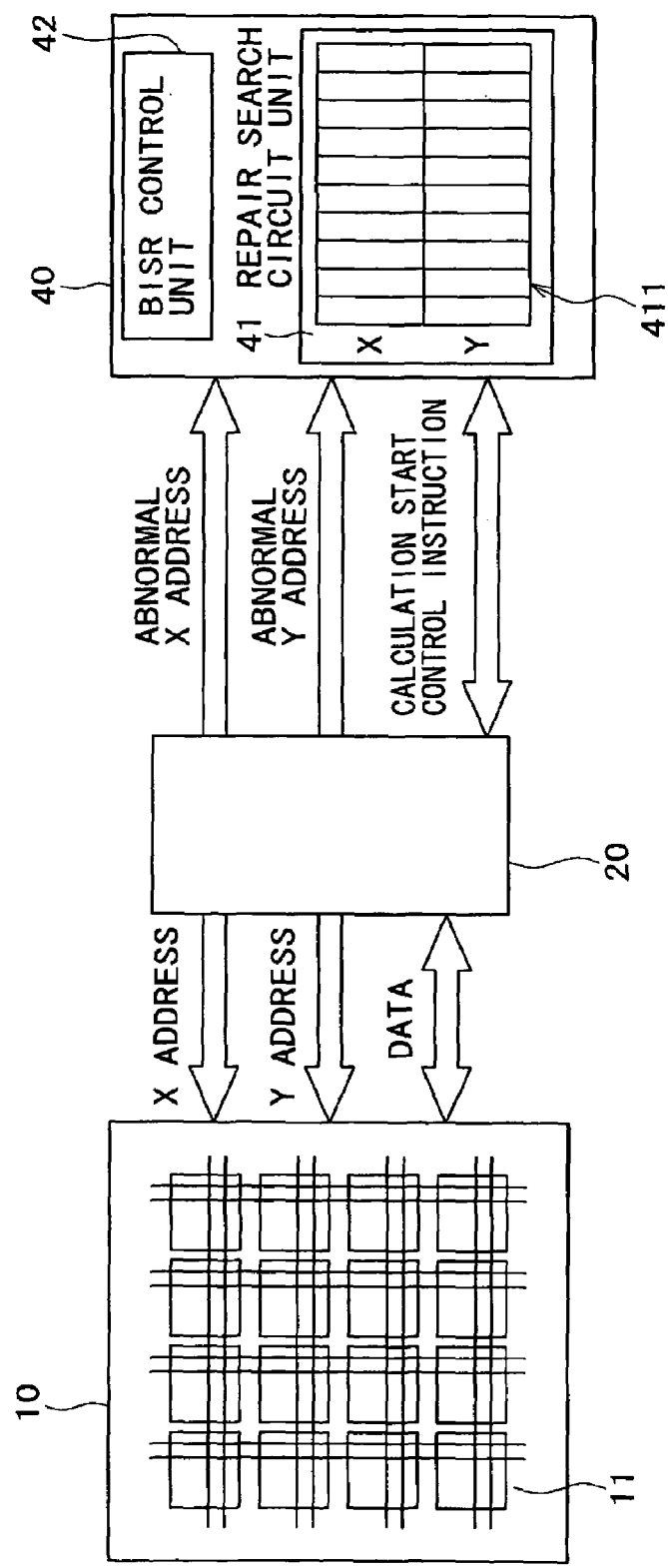
FIG. 6 is a block diagram showing a configuration of a semiconductor memory device according to a second embodiment of the present invention.

FIG. 6 is a block diagram showing an example of configuration of a semiconductor memory device according to a second embodiment of the present invention. In FIG. 6, the same parts as in FIG. 1 are identified by the same reference numerals. As is clear from FIG. 6, a semiconductor memory device (LSI) according to a second embodiment has a DRAM 10, a BIST circuit 20, and a BISR (built-in self-repair) circuit 40. These components are mounted on an identical LSI chip. Configurations and operations of the DRAM 10 and the BIST circuit 20 are basically the same as in the first embodiment.

The BISR circuit 40 is provided on the same LSI chip as the DRAM 10 together with the BIST circuit 20 to calculate on the chip how to use redundant lines 14 and 15 to repair abnormality on the basis of address information of abnormal bits detected by the BIST circuit 20 and repair the abnormal cells by redundant cells, that is, mask the abnormal cells by the redundant cells on the basis of a result of the calculation.

Figure 7:
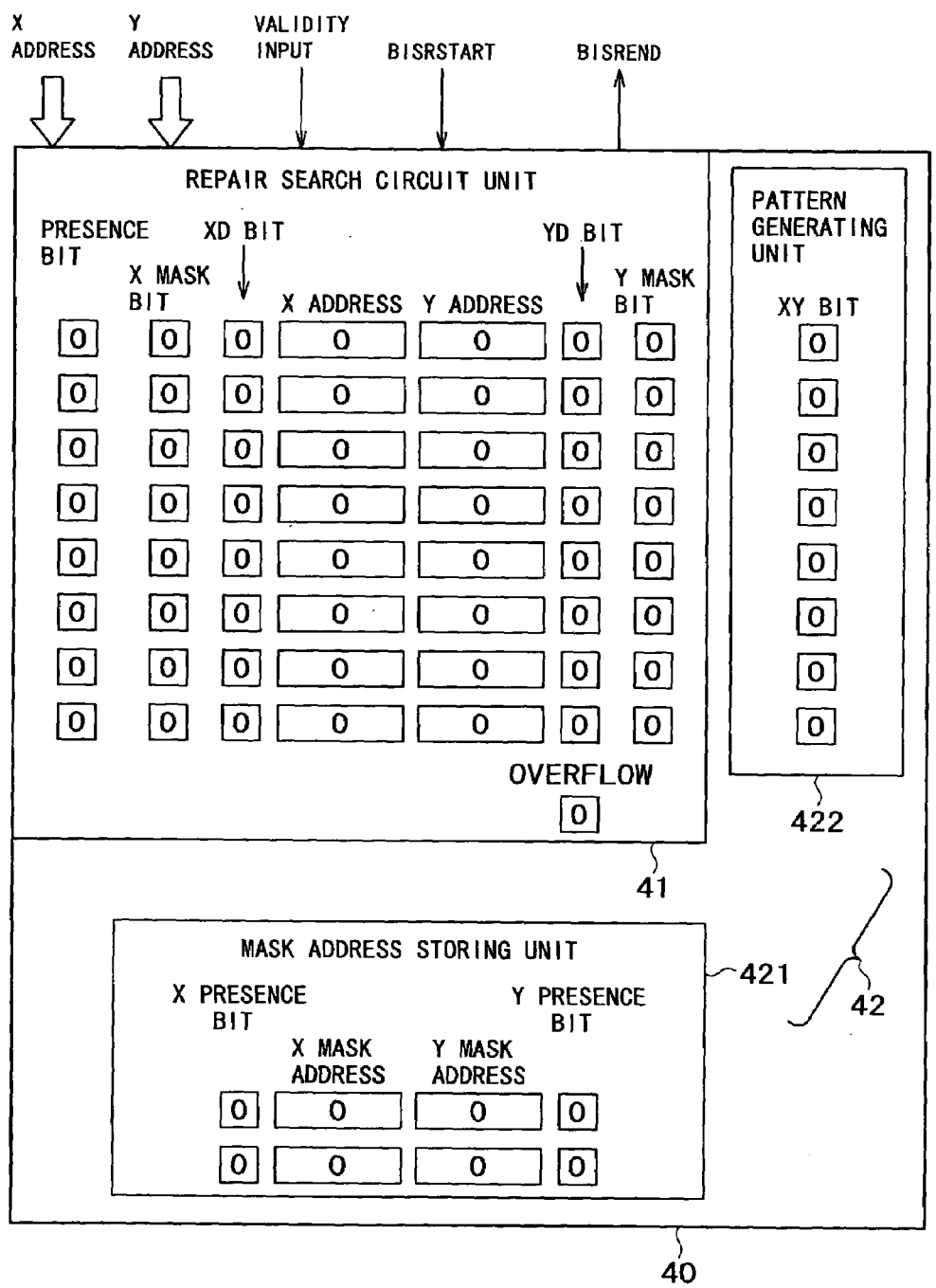
FIG. 7 is a block diagram showing a concrete example of configuration of a BISR circuit.

FIG. 7 is a block diagram showing a concrete example of configuration of the BISR circuit 40. The BISR circuit 40 in this configuration example has a repair search circuit unit 41 and a BISR control unit 42 to realize a repair function. The repair search circuit unit 41 in the BISR circuit 40 is supplied with an X and a Y address representing an abnormal bit detected by the BIST circuit 20 and valid bit information indicating validity of the X and Y addresses.

The repair search circuit unit 41 performs basically the same processing as the repair search circuit 30 in the first embodiment. Specifically, when an X and Y address pair of an abnormal bit is sent from the BIST circuit 20 to the repair search circuit unit 41, the repair search circuit unit 41 processes the received address pair in real time, and stores only a minimum of address pairs required to determine redundant lines to be used in a built-in buffer (memory) 411.

In order to output address information of abnormal bits from the BIST circuit 20, various test patterns are fed. Processing of performing all such operations and storing all abnormal bit address information in the buffer 411 in the repair search circuit unit 41 corresponds to the processing in stage one described in the first embodiment. When the processing in stage one is completed, the BISR circuit 40 is externally supplied with an instruction BISRSTART to start BISR calculation.

The BISR control unit 42 includes a mask address storing unit 421 and a pattern generating unit 422. In the pattern generating unit 422, a flag referred to as an XY bit is provided for an X and Y address pair of each abnormal bit. At the time of repair, such abnormal bits will surely be repaired (masked) by a redundant line in an X-direction or a Y-direction. At this time, an XY bit flag in the pattern generating unit 422 indicates whether to mask an abnormal bit by a redundant line in the X-direction or repair the abnormal bit by a redundant line in the Y-direction. For example, an XY bit flag of "1" indicates that the abnormal bit is to be repaired by a redundant line in the X-direction, that is, a column redundant line 15, and an XY bit flag of "0" indicates that the abnormal bit is to be repaired by a redundant line in the Y-direction, that is, a row redundant line 14.

When there are eight address pairs as in this example, there are also eight XY bit flags, which have 256 possible combinations. Repair is made in several combinations (not one combination) of the 256 combinations. The BISR control unit 42 sequentially creates the 256 combinations (combinations of 0 and 1). The BISR control unit 42 sequentially determines whether repair succeeds in each combination.

As described above, since the semiconductor memory device according to the second embodiment of the present invention employs a structure in which the BIST circuit 20 and the BISR circuit 40 are mounted on the same LSI chip as the DRAM 10, the semiconductor memory device can perform the processing of determining whether there is an abnormal bit, and when there is an abnormal bit, determining an address of the abnormal bit, the processing of storing only a minimum of address pairs required to determine redundant lines to be used in the buffer 411, and the processing of determining mask addresses at the LSI performance speed.

The processing performed in the BISR circuit 40 of the above-described configuration will next be described by taking a concrete example.

EXAMPLE

This concrete example deals with a case where BISR calculation is performed for each redundant block 11 (zero dimensions). Description will be made of a case where X and Y address pairs of abnormal bits sent from the BIST circuit 20 regarding one redundant block 11 are stored in the buffer 41 as shown in FIG. 4.

Figure 8:
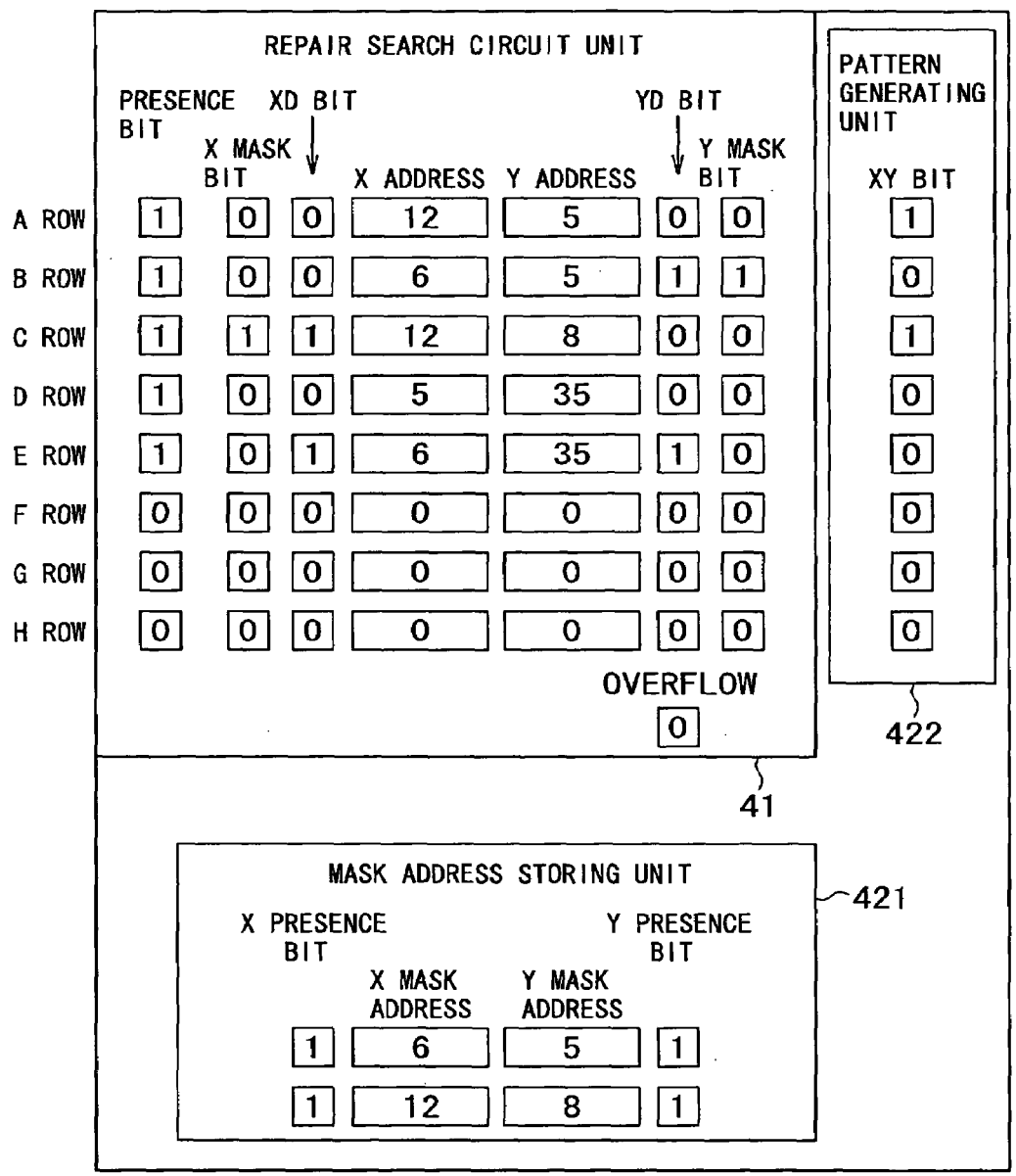
FIG. 8 is a diagram (1) of assistance in explaining processing of the concrete example of the BISR circuit.

(1) First, the pattern generating unit 422 generates an XY bit pattern. Suppose in this case that the generated XY bit pattern is 10100000 in order from an A row to an H row, as shown in FIG. 8.

(2) X and Y mask addresses selected sequentially from the A row are transferred to the mask address storing unit 421. In this case, an XY bit of the A row is "1," which indicates that the Y address of 5 is a mask address. The Y address of 5 is thus stored in the mask address storing unit 421. At this time, a presence bit for the Y address in the mask address storing unit 421 is set to "1" to indicate that the mask address is valid (the same is performed in the following similar processing).

(3) The B row has an XY bit of "0." In this case, the XY bit indicates that the X address of 6 is a mask address. Thus, the X address of 6 is stored in the mask address storing unit 421. Since the mask bit of the Y address is "1," the Y address of 5 is to be simultaneously stored in the mask address storing unit 421; however, since the Y address of 5 is already stored, no processing is performed.

(4) The C row has an XY bit of "1." Hence, in this case, the Y address of 8 is stored in the mask address storing unit 421. Since the X mask bit is "1," the X address of 12 is simultaneously stored in the mask address storing unit 421. At this point, 12 and 6 are stored in an X mask address part of the mask address storing unit 421, and 5 and 8 are stored in a Y mask address part of the mask address storing unit 421.

(5) The D row has an XY bit of "0." Hence, the X address of 5 is to be stored in the mask address storing unit 421. However, the X mask address part already stores two mask addresses, and is thus unable to store a third address (overflow). It therefore becomes clear at this stage that masking (repair) is impossible with this XY bit pattern.

Figure 9:
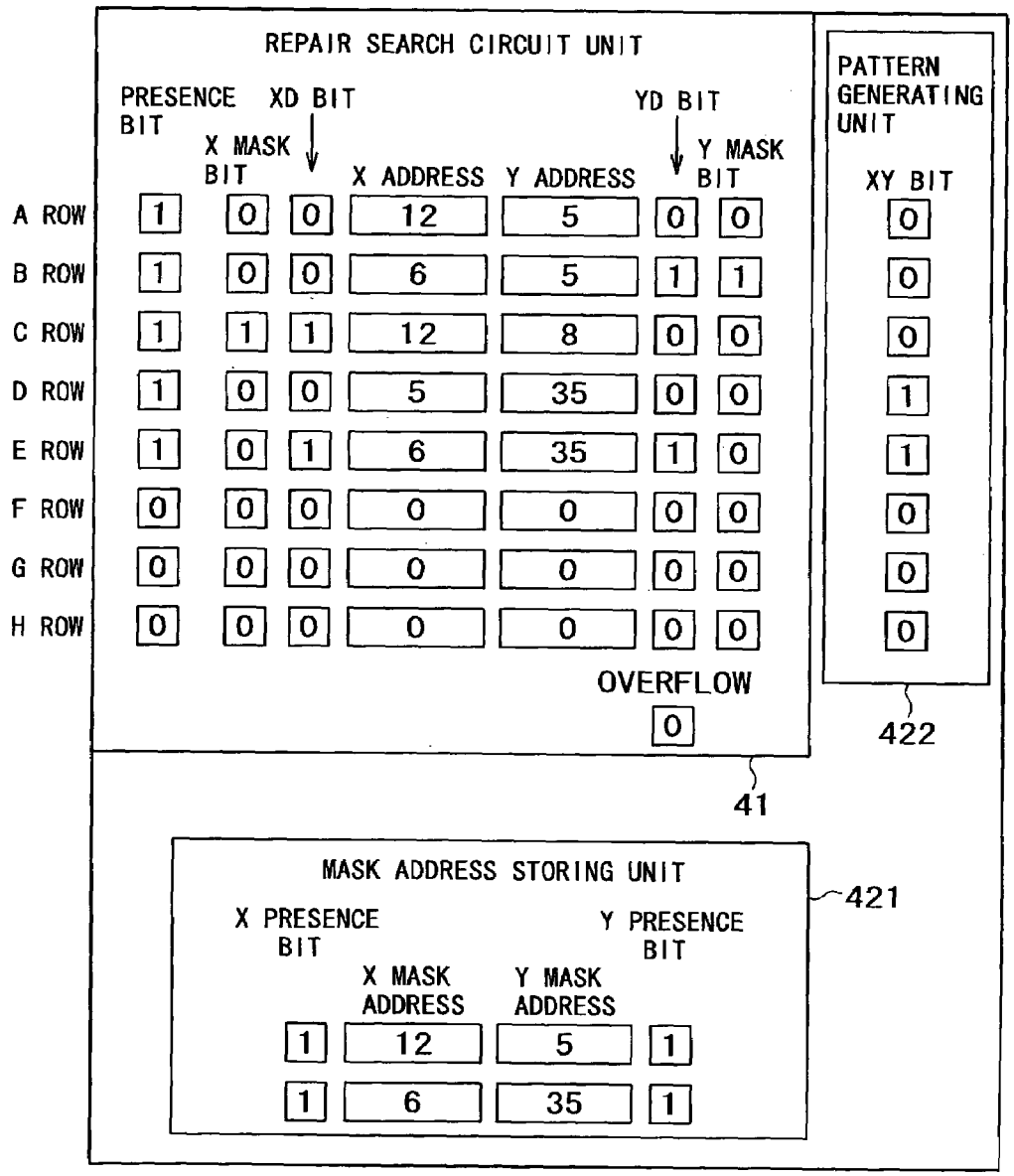
FIG. 9 is a diagram (2) of assistance in explaining processing of the concrete example of the BISR circuit.

(6) Since repair is impossible with this XY bit pattern, the pattern generating unit 422 generates a new XY bit pattern. Suppose that the newly generated pattern is 00011000 in order from the A row to the H row, as shown in FIG. 9.

(7) Mask addresses will be transferred again to the mask address storing unit 421 in order from the A row. In this case, the XY bit of the A row is "0," and therefore the X address of 12 is transferred to the mask address storing unit 421.

(8) The B row has an XY bit of "0." Hence, the X address of 6 is transferred to the mask address storing unit 421. At this time, since the mask bit of the Y address is "1," the Y address of 5 is simultaneously transferred to the mask address storing unit 421.

(9) Since the C row has an XY bit of "0" and the X mask bit is "1," the X address of 12 is to be transferred to the mask address storing unit 421. However, since the X address of 12 is already present in the mask address storing unit 421, no processing is performed.

(10) The D row has an XY bit of "1." Hence, the Y address of 35 is transferred to the mask address storing unit 421. At this point, 12 and 6 are stored as X mask addresses of the mask address storing unit 421, and 5 and 35 are stored as Y mask addresses of the mask address storing unit 421.

(11) The E row has an XY bit of "1." Therefore the Y address of 35 is to be transferred to the mask address storing unit 421. However, since the Y address of 35 is already stored in the mask address storing unit 421, no processing is performed.

(12) The F row has an XY bit of "0." However, since the presence bit of the F row is "0," which indicates that the X and Y address pair of this row has no meaning, no processing is performed for this row.

(13) The G and H rows also have a presence bit of "0." Therefore no processing is performed for these rows.

(14) At this point, processing for all rows is completed. Also, no overflow has occurred, with 12 and 6 stored as X mask addresses of the mask address storing unit 421, and with 5 and 35 stored as Y mask addresses of the mask address storing unit 421. This indicates that repair is possible with this combination of X and Y addresses. Hence, this combination is one solution obtained.

(15) When repair is impossible, a next XY bit pattern is tried. Then, if repair is impossible after all the 256 patterns are tried, it is ultimately determined that repair is impossible.

(16) When a result making repair possible is obtained, repair is thereafter made using the X and Y mask addresses.

Figure 10:
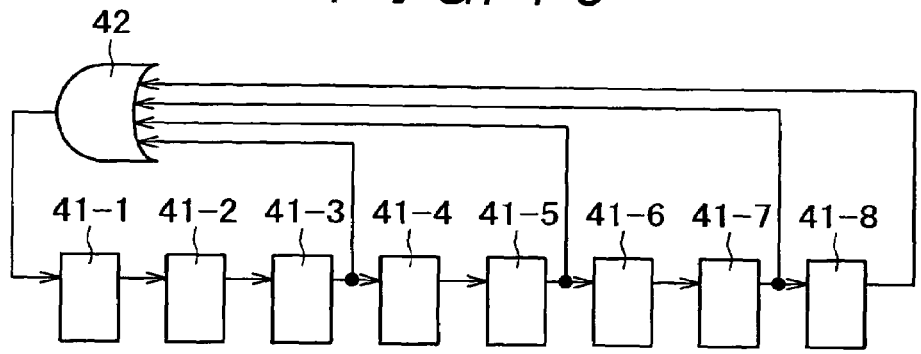
FIG. 10 is a block diagram showing an example of configuration of a linear feedback shift register.

In this case, the pattern generating unit 422 may be of an incremental type using an ordinary adder that increments in order from zero. The pattern generating unit 422 may use a linear feedback shift register configured such that as shown in FIG. 10, registers corresponding in number with that of buffers for X or Y addresses, or eight registers 41-1 to 41-8 in this example are connected in series with each other, and a logical sum of outputs of the registers 41-3, 41-5, 41-7, and 41-8 in the third, fifth, seventh, and eighth stages is obtained by an OR gate 42 and fed back to the register 41-1 in the first stage. The linear feedback shift register has an advantage of reduced circuit area as compared with the adder.

[Third Embodiment]

Figure 11A:
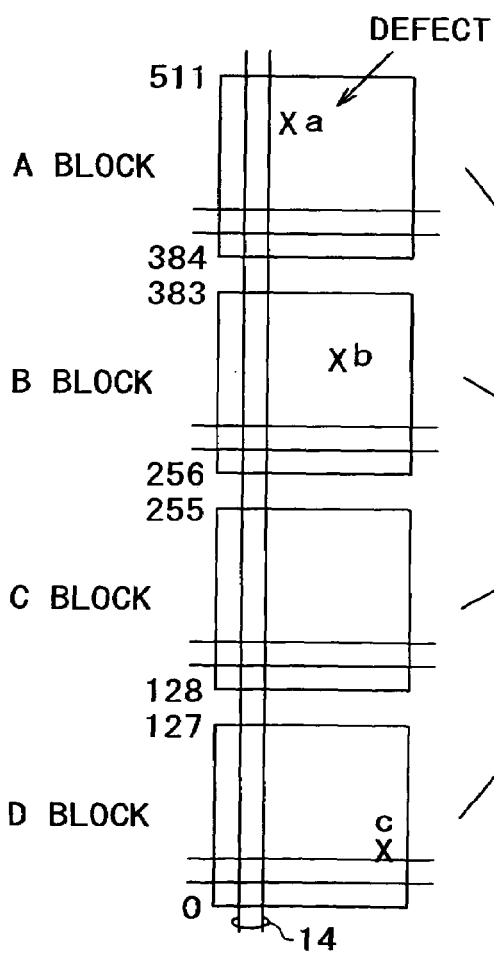
FIGS. 11A and 11B are diagrams of assistance in explaining a semiconductor memory device according to a third embodiment of the present invention.
Figure 11B:
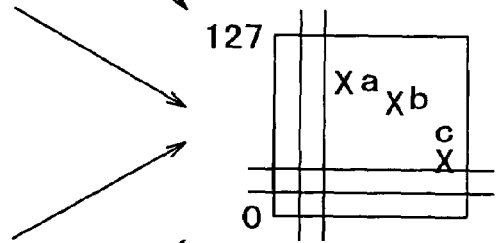

A semiconductor memory device according to a third embodiment deals with a case where redundant lines are arranged in a form of skewering a plurality of redundant blocks as described with reference to FIG. 2. As an example, suppose that for example four redundant blocks A to D are skewered by row redundant lines 14 as shown in FIG. 11A. In this case, the redundant blocks A to D are put together to become one with respect to Y addresses and appear as one redundant block, as shown in FIG. 11B.

Suppose that in practice, as shown in FIG. 11A, the redundant block A has Y addresses of 0 to 127, the redundant block B has Y addresses of 128 to 255, the redundant block C has Y addresses of 256 to 383, and the redundant block D has Y addresses of 384 to 511. In inputting addresses of abnormal (defective) bits to a BISR circuit 40, it suffices to perform address conversion for setting remainders obtained by dividing the Y addresses by 128 as addresses and inputting, to the BISR circuit 40, the addresses as Y addresses from 0 to 127 of the abnormal bits of all the redundant blocks A to D, as shown in FIG. 11B.

By performing address conversion for setting the addresses of the abnormal bits of all the redundant blocks A to D as Y addresses from 0 to 127 and inputting the Y addresses to the BISR circuit 40 as described above, the abnormal bits can be repaired as in the concrete example of the second embodiment even in the case of a DRAM configured such that redundant lines are arranged in a form of skewering a plurality of redundant blocks.

That is, in a case where common redundant lines are used for a plurality of unit blocks in a row direction or a column direction, each piece of address information of the plurality of unit blocks is converted into address information within one of the plurality of unit blocks, the plurality of unit blocks are superimposed on an address map to appear as one unit block, and redundant cell address information is generated on the basis of the converted address information, whereby abnormal bits can be repaired.

It is to be noted that while the third embodiment has been described by taking as an example a case of a skewered structure of one dimension in the Y-direction, this method is similarly applicable to a case of a skewered structure of one dimension in the X-direction or of two dimensions in the X-direction and the Y-direction. The method is also applicable to the case of repair being made in separate stages one and two as described earlier.

As described above, a repair search is made for each redundant block 11 by the BISR circuit 40 on the chip, and using final mask addresses determined by the repair search, mechanical fuses 12 and 13, for example Al fuses corresponding to the final mask addresses are blown, whereby repair is made.

When the mechanical fuses 12 and 13 typified by Al fuses are used in repair, the mechanical fuses, which require a large area for arrangement, as described above, prevent fine repair. Thus, in a present situation, the number of fuses 12 and 13 is reduced by arranging redundant lines 14 and 15 in a form of a skewer. Accordingly, a modification to be described below enables finer repair by using electric fuses as a fuse circuit in place of the mechanical fuses.

(Modification)

This modification uses a register circuit as an electric fuse. Specifically, after a BISR circuit 40 performs BISR calculation, a result of the calculation is saved in the register circuit, and repair is made by using a value of the register circuit. By thus using the electric fuse such as the register circuit or the like as a fuse circuit, and operating a BIST circuit 20 and the BISR circuit 40 each time the product is started, for example, to repair abnormal bits, the following effects can be obtained.

Since electric fuses are smaller in size and require a smaller space for arrangement than mechanical fuses, the electric fuses can be arranged for individual redundant blocks 11 without a skewer structure being used as in the case of using mechanical fuses. It is therefore possible to make finer repair in much smaller units of redundant blocks as compared with conventional repair in group units using mechanical fuses, and hence significantly improve memory failure recovery effects.

The fuse using the register circuit will be referred to as a register fuse. It is to be noted that the electric fuse is not limited to the register fuse, and that nonvolatile memories such as flash memories and the like and SRAMs can be used as the electric fuse in some cases. By using nonvolatile memories or SRAMs as electric fuses and saving a result of BISR calculation in the electric fuses, this state can be prevented from disappearing even when power is shut off.

Figure 12A:
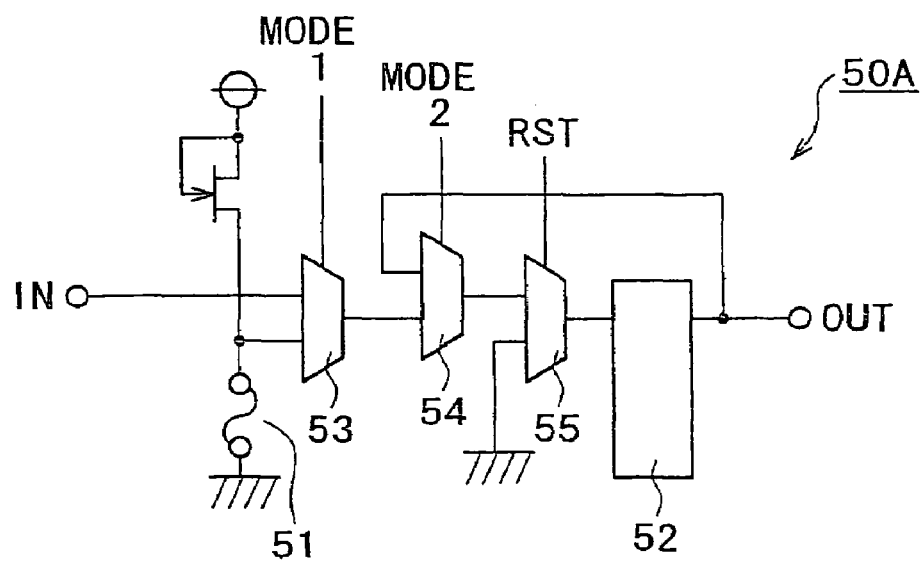
FIGS. 12A and 12B are block diagrams showing concrete examples of a fuse circuit according to a modification.
Figure 12B:
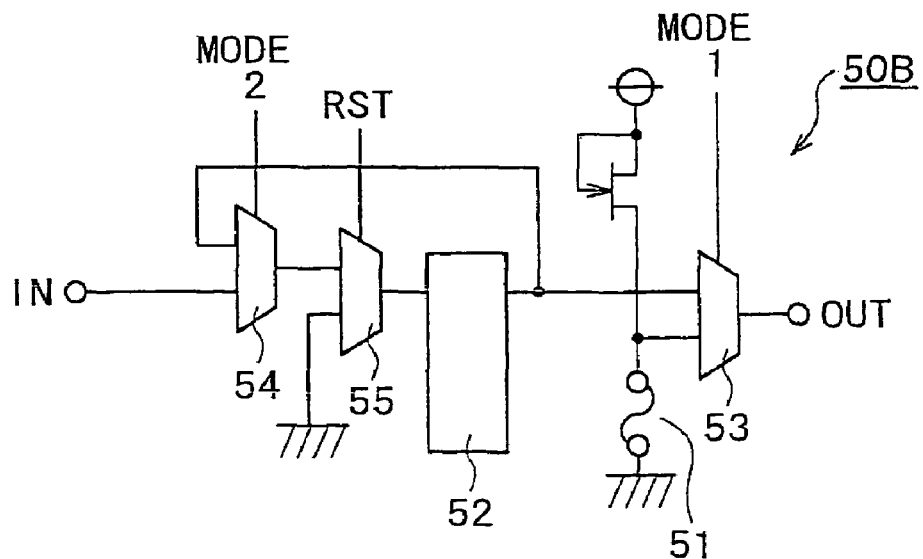

Concrete circuit examples of the fuse circuit for performing repair using an electric fuse are shown in FIGS. 12A and 12B. The fuse circuits 50A and 50B according to these circuit examples both use both an Al fuse 51 and a register fuse 52 and have selectors 53 and 54 operating in response to mode signals MODE1 and MODE2 and a selector 55 operated by a reset signal RST. The mode signal MODE1 is a switching signal for indicating whether to use the Al fuse 51 or whether to use the register fuse 52. The mode signal MODE2 is a switching signal for shift input of a BISR calculation result to the register fuse 52. The reset signal RST is a signal for resetting the register fuse 52.

As shown in FIG. 12A, the selector 53 in the fuse circuit 50A according to the first circuit example has one input terminal connected to a circuit input terminal IN and another input terminal connected to a power supply side terminal of the Al fuse 51. The selector 54 has one input terminal connected to an output terminal of the selector 53 and another input terminal connected to an output terminal of the register fuse 52. The selector 55 has one input terminal connected to an output terminal of the selector 54 and another input terminal connected to a ground. The register fuse 52 has an input terminal connected to an output terminal of the selector 55 and an output terminal connected to a circuit output terminal OUT.

As shown in FIG. 12B, the selector 54 in the fuse circuit 50B according to the second circuit example has one input terminal connected to a circuit input terminal IN and another input terminal connected to an output terminal of the register fuse 52. The selector 55 has one input terminal connected to an output terminal of the selector 54 and another input terminal connected to a ground. The register fuse 52 has an input terminal connected to an output terminal of the selector 55 and an output terminal connected to one input terminal of the selector 53. The selector 53 has another input terminal connected to a power supply side terminal of the Al fuse 51 and an output terminal connected to a circuit output terminal OUT.

The thus formed fuse circuits 50A and 50B according to the first and second circuit examples are mere examples of concrete circuit configuration. When one of the fuse circuits 50A and 50B is used and an address stored in the mask address storing unit 421 in FIG. 7 is transferred to the register fuse 52, repair is completed.

Figure 13:
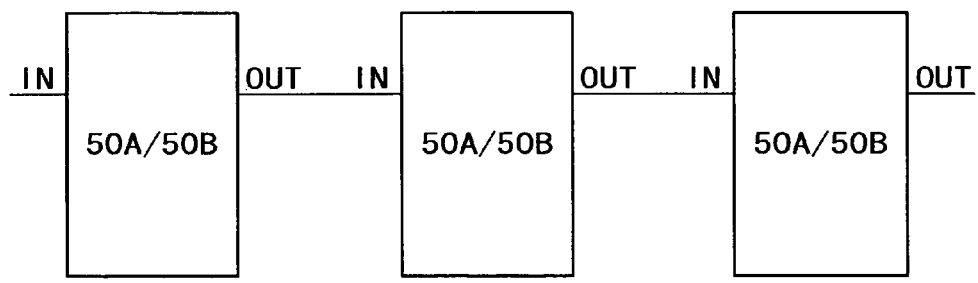
FIG. 13 is a block diagram showing a configuration when fuse circuits are connected into a form of a chain.

When circuit input terminals IN and circuit output terminals OUT of fuse circuits 50A or 50B shown in FIG. 12A or 12B are connected together to be arranged in a form of a chain as shown in FIG. 13, a mask address can be stored in each fuse circuit 50A or 50B by shifting the address stored in the mask address storing unit 421 using the shift chain.

(Another Modification)

Figure 14:
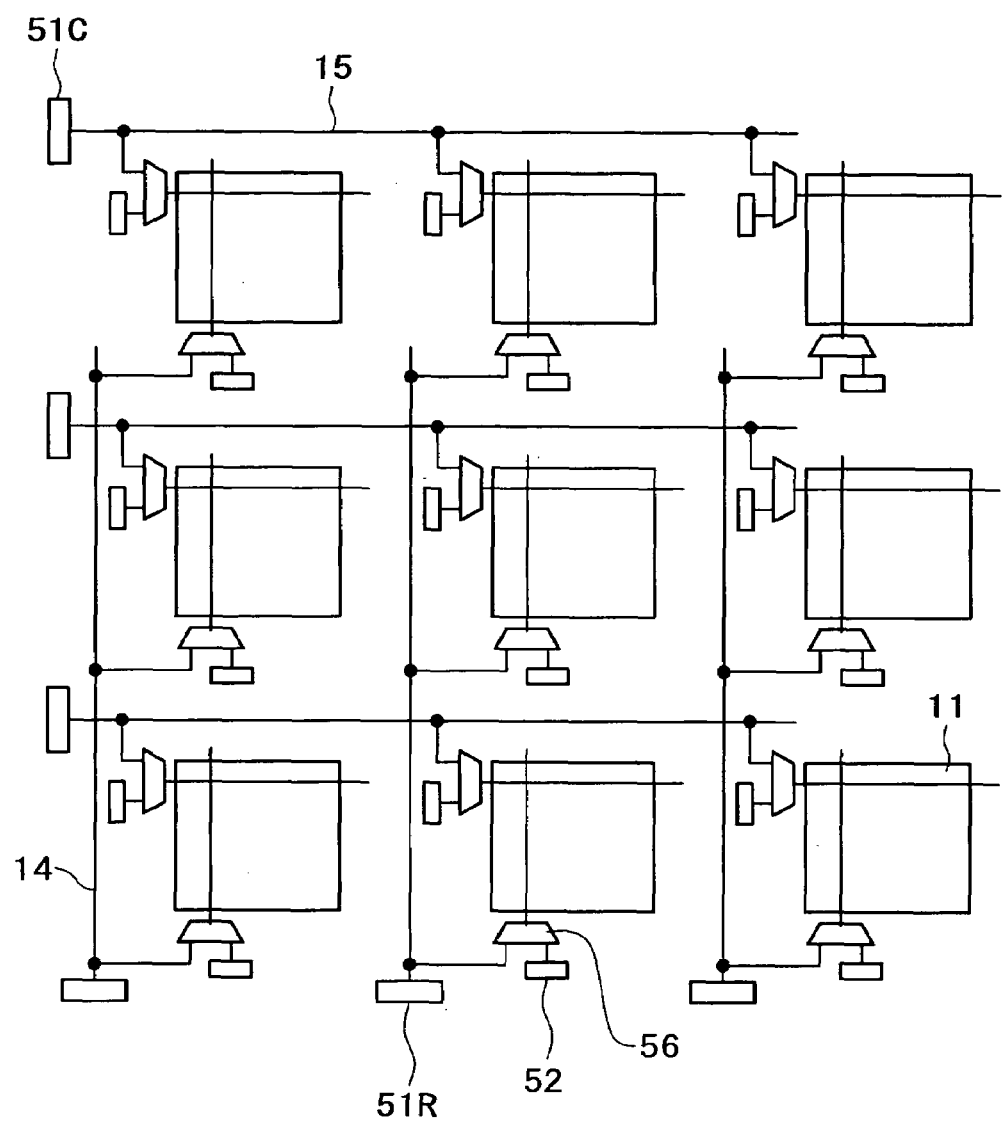
FIG. 14 is a block diagram showing a configuration of another modification.

This modification uses both Al fuses 51 and register fuses 52. A concrete configuration of the modification is shown in FIG. 14. In the present modification, an Al fuse 51 masks a redundant line piercing through redundant blocks 11 in a form of a skewer. A register fuse 52 masks each redundant block 11.

Specifically, a row redundant line 14 is arranged in the form of a skewer for individual redundant blocks 11 in each row, a column redundant line 15 is arranged in the form of a skewer for individual redundant blocks 11 in each column, and Al fuses 51R and 51C are provided for the respective redundant lines 14 and 15. A register fuse 52 is provided for each redundant block 11. A selector 56 switches between the Al fuse 51R or 51C and the register fuse 52.

By adopting such a configuration using both Al fuses 51R and 51C and register fuses 52, both permanent repair using the Al fuses 51R and 51C and fine repair using the register fuses 52 are made possible. Specifically, not only repair can be made at a time of shipment from a factory using the Al fuses 51R and 51C with the whole taken into consideration, but also repair is possible at a time of a start by a user, on a periodic basis, or when an abnormality occurs even after the shipment from the factory. As a result, a failure rate of the memory can be improved significantly.

In addition, the register fuses are smaller in size and require a smaller space for arrangement than the Al fuses, the register fuses can be arranged for individual redundant blocks 11 without a skewer structure being used as in the case of using the Al fuses. It is therefore possible to make repair in much smaller units of redundant blocks as compared with conventional repair using the Al fuses, and hence significantly improve memory failure recovery effects.

As described above, according to the present invention, of address pairs obtained by evaluating quality of individual memory cells, only a minimum of address pairs required to determine redundant cells for repairing abnormal cells are stored in storing means. Thus, a lower memory capacity is required as compared with a case of storing all the address pairs of the abnormal cells, and processing for calculating address information of the redundant cells for repairing the abnormal cells can be performed at high speed.

Further, of address pairs obtained by evaluating quality of individual memory cells, only a minimum of address pairs required to determine redundant cells for repairing abnormal cells are stored in storing means. Thus, a lower memory capacity required as compared with a case of storing all the address pairs of the abnormal cells results in a correspondingly smaller circuit scale. In addition, built-in self-repair means for calculating address information of the redundant cells for repairing the abnormal cells on the basis of the address pairs stored in the storing means is mounted on the same chip as a memory unit. It is therefore possible to perform processing for the calculation at performance speed of the memory unit, and thus perform the calculation processing at high speed.

While the preferred embodiments of the present invention have been described using specific terms, such description is for illustrative purposes only, and it is to be understood that changes and variations may be made without departing from the spirit or scope of the appended claims.

What is claimed is:

1. A semiconductor memory device comprising:
   a memory unit including a memory core formed by arranging a plurality of memory cells in a form of a matrix, a block as a unit having a redundant line comprising redundant cells for repairing an abnormal cell occurring in the memory core, and further one such unit block or a plurality of such unit blocks arranged in a form of a matrix;
   built-in self-test means mounted on a same chip as said memory unit, for evaluating quality of each of said memory cells;
   storing means mounted on the same chip as said memory unit; and
   repair search means for storing in said storing means only a minimum of address pairs required to determine redundant cells for repair among address pairs in a row direction and a column direction of abnormal cells, the address pairs being sent from said built-in self-test means.

2. A semiconductor memory device as claimed in claim 1, wherein said repair search means is provided for each said unit block.

3. A semiconductor memory device as claimed in claim 1, wherein letting n1 be a number of redundant lines in the row direction and n2 be a number of redundant lines in the column direction, said storing means has a buffer capacity of (2×n1×n2) buffers as a buffer capacity for storing said address pairs.

4. A semiconductor memory device as claimed in claim 1, wherein said repair search means has a flag indicating a number of address pairs having a row-direction address of a same value as an address pair stored in said storing means and a number of address pairs having a column-direction address of a same value as the address pair stored in said storing means; and
   said repair search means determines whether the address is to be set as a final repair address on the basis of the flag.

5. A semiconductor memory device as claimed in claim 1, wherein said repair search means has a bit for distinguishing a row-direction repair address and a column-direction repair address set as a repair address among row-direction addresses and column-direction addresses stored in said storing means.

6. A semiconductor memory device comprising:
   a memory unit including a memory core formed by arranging a plurality of memory cells in a form of a matrix, a block as a unit having a redundant line comprising redundant cells for repairing an abnormal cell occurring in the memory core, and further one such unit block or a plurality of such unit blocks arranged in a form of a matrix;
   built-in self-test means mounted on a same chip as said memory unit, for evaluating quality of each of said memory cells;
   storing means mounted on the same chip as said memory unit;
   repair search means for storing in said storing means only a minimum of address pairs required to determine redundant cells for repair among address pairs in a row direction and a column direction of abnormal cells, the address pairs being sent from said built-in self-test means; and
   built-in self-repair means mounted on the same chip as said memory unit, for calculating final repair address information of the redundant cells for repairing the abnormal cells on the basis of the address pairs stored in said storing means.

7. A semiconductor memory device as claimed in claim 6, wherein said memory unit has a fuse for selecting a redundant cell for repairing an abnormal cell; and said built-in self-repair means specifies said fuse on the basis of the calculated final repair address information.

8. A semiconductor memory device as claimed in claim 6, wherein said built-in self-repair means first gives an arbitrary pattern set to all the address pairs of abnormal cells stored in said storing means, the arbitrary pattern set indicating whether repair is made by a redundant line in the column direction or whether repair is made by a redundant line in the row direction, and then determines whether repair can be made; and when repair cannot be made, said built-in self-repair means gives a next pattern set, and when a pattern set enabling repair is found, said built-in self-repair means generates final repair address information of the redundant cells for repair on the basis of the pattern set.

9. A semiconductor memory device as claimed in claim 8, wherein said built-in self-repair means uses a 1-bit flag, and the flag indicates whether each abnormal cell is repaired by a redundant line in the column direction or by a redundant line in the row direction.

10. A semiconductor memory device as claimed in claim 9, wherein said 1-bit flag is provided for each address pair stored in said storing means.

11. A semiconductor memory device as claimed in claim 8, wherein in determining whether repair can be made after giving a pattern set, said built-in self-repair means has address storing means for storing address information of redundant lines for replacing abnormal cells and determines whether said pattern set enables repair by comparing a number of pieces of address information stored in said address storing means with a number of redundant lines.

12. A semiconductor memory device as claimed in claim 7, wherein said fuse is an electric fuse that, when a repair address is determined by said built-in self-repair means, selects a corresponding redundant cell by setting information of the repair address in the fuse.

13. A semiconductor memory device as claimed in claim 12, wherein said electric fuse includes a register.

14. A semiconductor memory device as claimed in claim 12, wherein a plurality of said registers are connected into a form of a chain, and the final repair address information calculated by said built-in self-repair means is transferred to the individual registers by shift operation.

15. A semiconductor memory device as claimed in claim 12, wherein said electric fuse includes a nonvolatile memory.

16. A semiconductor memory device as claimed in claim 12, wherein said fuse includes a mechanical fuse and an electric fuse, and one of the two fuses is selected and used.

17. A repair search method in a semiconductor memory device, said semiconductor memory device comprising:

a memory unit including a memory core formed by arranging a plurality of memory cells in a form of a matrix, a block as a unit having a redundant line comprising redundant cells for repairing an abnormal cell occurring in the memory core, and further one such unit block or a plurality of such unit blocks arranged in a form of a matrix;

built-in self-test means mounted on a same chip as said memory unit, for evaluating quality of each of said memory cells;

storing means mounted on the same chip as said memory unit; and repair search means for storing in said storing means only a minimum of address pairs required to determine redundant cells for repair among address pairs in a row direction and a column direction of abnormal cells, the address pairs being sent from said built-in self-test means;

wherein final repair address information of redundant cells for repairing the abnormal cells is determined for each said unit block on the basis of the address pairs stored in said storing means.

18. A repair search method as claimed in claim 17, wherein when said redundant line is commonly used by a plurality of unit blocks in the row direction or the column direction, address information of a redundant line for repairing an abnormal cell is determined for each of said plurality of unit blocks; and the determined address information is given to the other unit blocks, and using the given address information, final repair address information of redundant cells for repairing abnormal cells is determined for said plurality of unit blocks.

19. A repair search method as claimed in claim 18, wherein processing is repeated in which an address pattern set of redundant cells enabling repair is found for one of said plurality of unit blocks, the found address pattern set imposes a limitation on another unit block, an address pattern set of redundant cells enabling repair is generated for the other unit block under the limitation, and a limitation is imposed on yet another unit block on the basis of a result of the address pattern set.

20. A self-repair method in a semiconductor memory device, said semiconductor memory device comprising:

a memory unit including a memory core formed by arranging a plurality of memory cells in a form of a matrix, a block as a unit having a redundant line comprising redundant cells for repairing an abnormal cell occurring in the memory core, and further one such unit block or a plurality of such unit blocks arranged in a form of a matrix;

built-in self-test means mounted on a same chip as said memory unit, for evaluating quality of each of said memory cells;

storing means mounted on the same chip as said memory unit; and repair search means for storing in said storing means only a minimum of address pairs required to determine redundant cells for repair among address pairs in a row direction and a column direction of abnormal cells, the address pairs being sent from said built-in self-test means;

wherein an arbitrary pattern set indicating whether repair is made by a redundant line in the column direction or whether repair is made by a redundant line in the row direction is first given to all the address pairs of abnormal cells stored in said storing means, and then whether repair can be made is determined; and when repair cannot be made, a next pattern set is given, and when a pattern set enabling repair is found, final repair address information of the redundant cells for repair is generated on the basis of the pattern set.

21. A self-repair method as claimed in claim 20, wherein address information of redundant cells for repairing abnormal cells is stored and whether said pattern set enables repair is determined by comparing a number of pieces of said address information stored with a number of redundant lines.

22. A self-repair method as claimed in claim 20, wherein processing for generating the address information of said redundant cells is performed when power to said semiconductor memory device is turned on.

23. A self-repair method as claimed in claim 20, wherein processing for generating the address information of said redundant cells is performed periodically or when an abnormal cell occurs.

24. A self-repair method as claimed in claim 20, wherein when said redundant line is commonly used by a plurality of unit blocks in the row direction or the column direction, each piece of address information of said plurality of unit blocks is converted into address information within one of said plurality of unit blocks, said plurality of unit blocks are superimposed on an address map to appear as one unit block, and the address information of said redundant cells is generated on the basis of the converted address information.

* * * * *